(12) United States Patent
Zhu et al.

(10) Patent No.: US 9,087,691 B2
(45) Date of Patent: Jul. 21, 2015

(54) METHOD FOR MANUFACTURING GRAPHENE NANO-RIBBON, MOSFET AND METHOD FOR MANUFACTURING THE SAME

(75) Inventors: Huilong Zhu, Poughkeepsie, NY (US); Qingqing Liang, Lagrangeville, NY (US); Zhijiong Luo, Poughkeepsie, NY (US); Haizhou Yin, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 472 days.

(21) Appl. No.: 13/510,390

(22) PCT Filed: Nov. 18, 2011

(86) PCT No.: PCT/CN2011/082418
§ 371 (c)(1),
(2), (4) Date: May 17, 2012

(87) PCT Pub. No.: WO2013/037166
PCT Pub. Date: Mar. 21, 2013

(65) Prior Publication Data
US 2013/0069041 A1    Mar. 21, 2013

(30) Foreign Application Priority Data
Sep. 16, 2011    (CN) .......................... 2011 1 0274354

(51) Int. Cl.
*H01L 21/336* (2006.01)
*H01L 21/8234* (2006.01)
(Continued)

(52) U.S. Cl.
CPC ............. *H01L 21/0242* (2013.01); *B82Y 10/00* (2013.01); *H01L 21/02422* (2013.01); *H01L 21/02488* (2013.01); *H01L 21/02491* (2013.01); *H01L 21/02507* (2013.01); *H01L 21/02527* (2013.01); *H01L 21/02639* (2013.01); *H01L 29/0673* (2013.01); *H01L 29/1606* (2013.01); *H01L 29/2003* (2013.01);
(Continued)

(58) Field of Classification Search
None
See application file for complete search history.

(56) References Cited

U.S. PATENT DOCUMENTS

| 8,394,682 B2 * | 3/2013 | Sandhu .......................... 438/131 |
| 2009/0181502 A1 | 7/2009 | Parikh et al. .................. 438/164 |

(Continued)

OTHER PUBLICATIONS

Search Report from Application No. PCT/CN2011/082418, dated Jul. 5, 2012.

(Continued)

*Primary Examiner* — Calvin Choi
(74) *Attorney, Agent, or Firm* — Westman, Champlin & Koehler, P.A.

(57) ABSTRACT

A MOSFET with a graphene nano-ribbon, and a method for manufacturing the same are provided. The MOSFET comprises an insulating substrate; and an oxide protection layer on the insulating substrate. At least one graphene nano-ribbon is embedded in the oxide protection layer and has a surface which is exposed at a side surface of the oxide protection layer. A channel region is provided in each of the at least one graphene nano-ribbon. A source region and a drain regions are provided in each of the at least one graphene nano-ribbon. The channel region is located between the source region and the drain region. A gate dielectric is positioned on the at least one graphene nano-ribbon. A gate conductor on the gate dielectric. A source and drain contacts contact the source region and the drain region respectively on the side surface of the oxide protection layer.

11 Claims, 9 Drawing Sheets

(51) Int. Cl.
*H01L 21/20* (2006.01)
*H01L 21/36* (2006.01)
*H01L 21/02* (2006.01)
*H01L 29/775* (2006.01)
*H01L 29/06* (2006.01)
*H01L 29/16* (2006.01)
*H01L 29/20* (2006.01)
*H01L 29/66* (2006.01)
*H01L 29/786* (2006.01)
*B82Y 10/00* (2011.01)
*B82Y 40/00* (2011.01)
*B82Y 30/00* (2011.01)

(52) U.S. Cl.
CPC ....... *H01L 29/66742* (2013.01); *H01L 29/775* (2013.01); *H01L 29/78684* (2013.01); *H01L 29/78696* (2013.01); *B82Y 30/00* (2013.01); *B82Y 40/00* (2013.01)

(56) References Cited

U.S. PATENT DOCUMENTS

| | | | |
|---|---|---|---|
| 2010/0003462 A1 | 1/2010 | Kamins et al. | 428/166 |
| 2010/0055388 A1 | 3/2010 | Chen et al. | 428/119 |
| 2010/0102292 A1 | 4/2010 | Hiura et al. | 257/9 |
| 2010/0295119 A1 | 11/2010 | Sandhu et al. | 257/329 |
| 2012/0248414 A1* | 10/2012 | Kim et al. | 257/29 |
| 2012/0256167 A1* | 10/2012 | Heo et al. | 257/27 |
| 2012/0261643 A1* | 10/2012 | Cohen et al. | 257/27 |

OTHER PUBLICATIONS

Written Opinion from Application No. PCT/CN2011/082418, dated Jun. 13, 2012.

\* cited by examiner

METHOD FOR MANUFACTURING GRAPHENE NANO-RIBBON, MOSFET AND METHOD FOR MANUFACTURING THE SAME

CROSS-REFERENCE TO RELATED APPLICATION

This Application is a Section 371 National Stage Application of International Application No. PCT/cn2011/082418, filed ON Nov. 18, 2011, entitled METHOD FOR MANUFACTURING GRAPHENE NANO-RIBBON, MOSFET AND METHOD FOR MANUFACTURING THE SAME, which claimed priority to Chinese Application No. 201110274354.1, field on Sep. 16, 2001. Both the PCT Application and Chinese Application are incorporated herein by reference in their entireties.

TECHNICAL FIELD

The present application relates to a method for manufacturing a graphene nano-ribbon, a semiconductor-oxide-semiconductor field effect transistor (MOSFET) and a method for manufacturing the same, and in particular, to a MOSFET having a graphene channel and a method for manufacturing the same.

BACKGROUND

Graphene is a single-layer crystal arranged in a two-dimensional honeycomb lattice by carbon atoms in $SP^2$ hybridization. The graphene is not limited to a graphite in a single-layer structure of carbon atoms, but can be a graphite comprising two or more layers of carbon atoms, as long as it behaviors like a two-dimensional crystal.

Studies on semiconductor devices using graphene have been conducted recently. A graphene nano-ribbon has a nanoscale width. Due to a size effect, the graphene nano-ribbon has a limited band gap and behaviors like a semiconductor.

U.S. patent application No. US2010/0102292A1, by Hidefumi Hiura, et al., discloses a semiconductor device using graphenes, in which a graphene semiconductor is suitably doped to provide a channel region, and a graphene metal is used to provided source/drain regions and a gate.

However, the above semiconductor device uses only a single graphene nano-ribbon to form the channel region, and carries only a small amount of on-state current.

Moreover, the known methods for manufacturing the graphene nano-ribbon include either the steps of forming a graphene layer by pyrolyzation and patterning the graphene layer, or the steps of stripping a thin graphene layer from a thick graphene layer and transferring the thin layer, to form a graphene layer having both a nanoscale thickness and a nanoscale width. The known methods for manufacturing the graphene nano-ribbon are expensive in cost and may result in fluctuation in processes, because it is difficult to control sizes of the grapheme nano-ribbon in both dimensions.

SUMMARY OF THE DISCLOSURE

One object of the present disclosure is to provide a novel method for manufacturing a graphene nano-ribbon and a novel MOSFET comprising the MOSFET. The MOSFET has improved properties and reduced manufacture cost.

According to one aspect of the present disclosure, there is provided a method for manufacturing a graphene nano-ribbon, comprising:
forming a stack of a seed layer and a growth blocking layer on an insulating substrate;
patterning the stack of the seed layer and the growth blocking layer to form at least one stack stripe which exposes a side surface of the seed layer; and
growing a graphene nano-ribbon at the side surface of the seed layer.

According to another aspect of the disclosure, there is provided a method for manufacturing a MOSFET, comprising:
manufacturing the graphene nano-ribbon with the above method;
forming an oxide protection layer between the at least one stack stripe so that the graphene nano-ribbon is embedded in the oxide protection layer;
removing the at least one stack stripe to form a trench which exposes a surface of the graphene nano-ribbon at a side surface of the oxide protection layer;
forming a stack of a gate dielectric and a gate conductor on the graphene nano-ribbon;
forming sidewall spacers at both sides of the gate conductor;
forming a source region and a drain region at portions of the graphene nano-ribbon; and
filling the trench in the oxide protection layer with a metal so as to form a source contact for the source region and a drain contact for the drain region.

According to another aspect of the present disclosure, there is provided a MOSFET comprising an insulating substrate; an oxide protection layer on the insulating substrate; at least one graphene nano-ribbon embedded in the oxide protection layer and having a surface which is exposed at a side surface of the oxide protection layer; a channel region in each of the at least one graphene nano-ribbon; a source region and a drain region in each of the at least one graphene nano-ribbon, the channel region being located between the source region and the drain region; a gate dielectric on the at least one graphene nano-ribbon; a gate conductor on the gate dielectric; and a source contact and a drain contact which contact the source region and the drain region respectively on the side surface of the oxide protection layer.

In the present method, the graphene nano-ribbon can have a thickness substantially equal to one layer, two layers or more layers of carbon atoms of graphite by controlling a growth condition. Moreover, the graphene nano-ribbon has a width dependent on a thickness of the seed layer. The present method reduces manufacture cost because the graphene nano-ribbon can have the desired width by controlling the thickness of the seed layer, without the need for additional patterning processes or layer transfer processes.

Consequently, the present method can well control the sizes of the graphene nano-ribbon in two dimensions (i.e. thickness and width).

The present MOSFET also has the above beneficial effects. Moreover, it has improved properties because a plurality of graphene nano-ribbons can be used in the channel region to increase on-state current.

DETAILED DESCRIPTION

Figure 1:
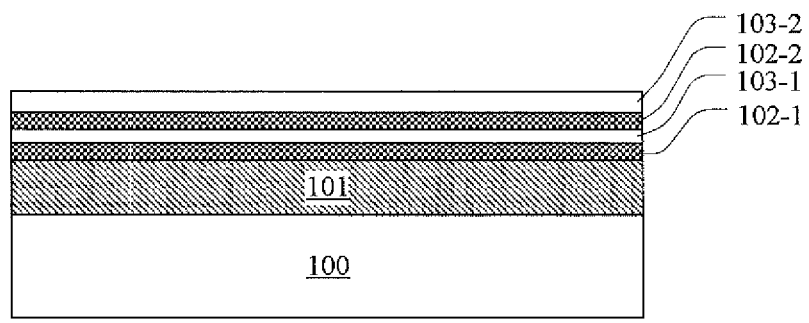
FIGS. 1-3 schematically show cross-sectional views in various steps of a method for manufacturing a graphene nano-ribbon according to embodiments of the present disclosure, respectively.

Exemplary embodiments of the present disclosure will be described in more details below with reference to the accompanying drawings. In the drawings, like reference numerals denote like portions. The figures are not drawn to scale, for the sake of clarity.

Some particular details of the present disclosure will be described below, such as exemplary semiconductor structures, materials, dimensions, process steps and techniques of the semiconductor device for better understanding of the present disclosure. However, it can be understood by one skilled person in the art that these details are not always essential, but can be varied in a specific implementation of the disclosure. Unless the context clearly indicates otherwise, each part of the semiconductor device can be made of material(s) well known to one skilled person in the art.

In the present application, the term "semiconductor structure" generally means the whole semiconductor structure formed at each step of the method for manufacturing the semiconductor device, including a semiconductor substrate and all of the layers and regions having been formed on the semiconductor substrate.

Figure 2:
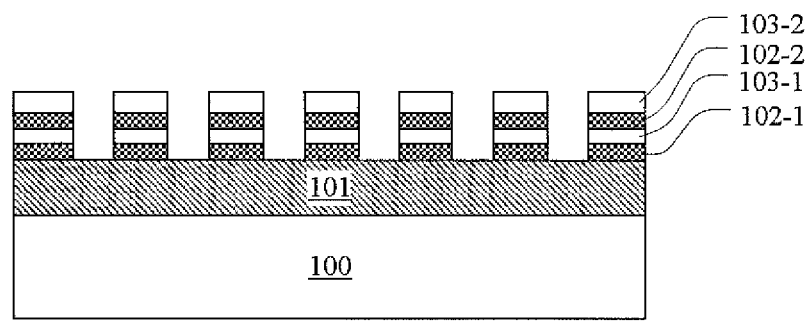
Figure 3:
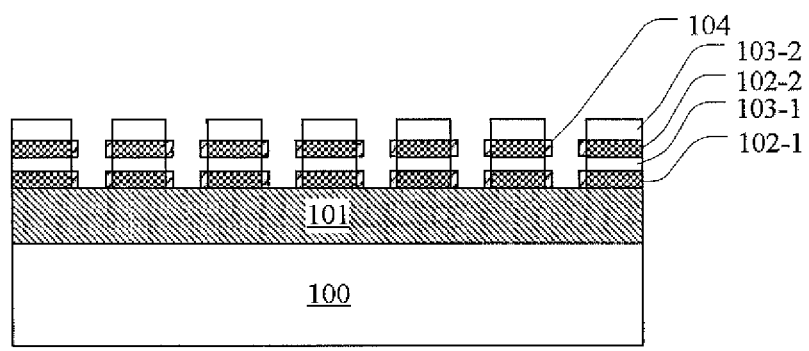

According to one preferable embodiment of the present disclosure, the steps shown in FIGS. 1 to 3 are performed in sequence for manufacturing a graphene nano-ribbon.

As shown in FIG. 1, an oxide base layer is formed on a semiconductor substrate 100 by thermal oxidation or sputtering. Seed layers 102-1, 102-2 and growth blocking layers 103-1, 103-2 are alternately formed on the oxide base layers 101. Between the step of forming each of the seed layers 102-1, 102-2 and the step of forming the subsequent one of the growth blocking layers 103-1, 103-2, the seed layers 102-1, 102-2 are thermal annealed for re-crystallization or growth of grains.

The above combination of the semiconductor substrate 100 and the oxide base layer 101 can be replaced by an insulating substrate, such as a glass substrate, or a strontium titanate (STO) substrate.

Conventional deposition processes are used for forming the seed layers 102-1, 102-2, such as physical vapor deposition (PVD), for example, e-beam evaporation, molecular beam epitaxy, or sputtering; chemical vapor deposition (CVD), for example, atomic layer deposition (ALD), metal organic chemical vapor deposition, plasma enhanced CVD (PECVD), low-pressure CVD (LPCVD); or the like. The conventional deposition processes are not limited to know techniques, but also include future deposition processes for forming a target layer.

Preferably, the seed layers 102-1, 102-2 may be formed by e-beam evaporation, and the growth blocking layers 103-1, 103-2 may be formed by CVD.

The seed layers 102-1, 102-2 serve as a nucleation layer for growing graphene and can be made of a transition metal, such as Ni, Co, Pt, Ir or Ru. The thickness of the seed layers 102-1, 102-2, for example, in the range of about 5-20 nm, determines the width of the graphene nano-ribbon to be formed, The growth blocking layers 103-1, 103-2 block growth of graphene thereon, and can be made of nitrides. The growth blocking layers 103-1, 103-2 can have any suitable thickness. The growth blocking layers 103-1, 103-2 cover surfaces of the seed layers 102-1, 102-2 so that graphene can only grow on side surfaces of the seed layers 102-1, 102-2.

Preferably, the seed layers 102-1, 102-2 and the growth blocking layers 103-1, 103-2 may be formed as a supperlattice to minimize crystalline defects and have a uniform thickness.

Although the seed layers are shown as two layers in FIG. 1, more seed layers can be formed as required. The number of the seed layers stacked in a vertical direction is equal to the number of graphene nano-ribbon to be stacked in the vertical direction. The number of the graphene channels to be stacked in a vertical direction can be determined from the design requirement of a MOSFET, Consequently, the number of the seed layers to be stacked in the vertical direction can also be determined.

Then, the stack of the seed layers 102-1, 102-2 and the growth blocking layers 103-1, 103-2 are patterned to form a plurality of stack stripes which are separated from each other and extend in a direction perpendicular to the paper sheet, as shown in FIG. 2. Each stack stripe comprises alternatively stacked seed layers 102-1, 102-2 and growth blocking layers 103-1, 103-2, and exposes at least side surfaces of the seed layers 102-1, 102-2.

The patterning process may involve the following steps: a photoresist mask having patterns therein is formed on the growth blocking layer 103-2 by a conventional lithographical process including exposure and development steps; the exposed portions of the growth blocking layer 103-2, the seed layer 102-2, the growth blocking layer 103-1 and the seed layer 102-1 are removed from top to bottom by anisotropic dry etching, such as ion beam milling, plasma etching, reactive ion etching, laser ablation and the like, which stops on the top of the oxide bas layer 101; and the photoresist mask is then removed by ashing or dissolution with a solvent.

A thermal anneal follows the patterning process to repair damages in the side surfaces of the seed layers 102-1, 102-2.

Then, graphene nano-ribbons are grown on the side surfaces of the seed layers 102-1, 102-2 by CVD, for example, at the temperature of about 900-1000° C. under an ambient pressure with a highly diluted hydrocarbon flow into a reaction chamber, as shown in FIG. 3.

The graphene nano-ribbons are selectively grown on the exposed side surfaces of the seed layers.

According to one preferable embodiment of the present disclosure, after forming the graphene nano-ribbons in the steps shown in FIGS. 1-3, the steps shown in FIGS. 4 to 10 are performed in sequence for manufacturing a MOSFET.

Figure 4:
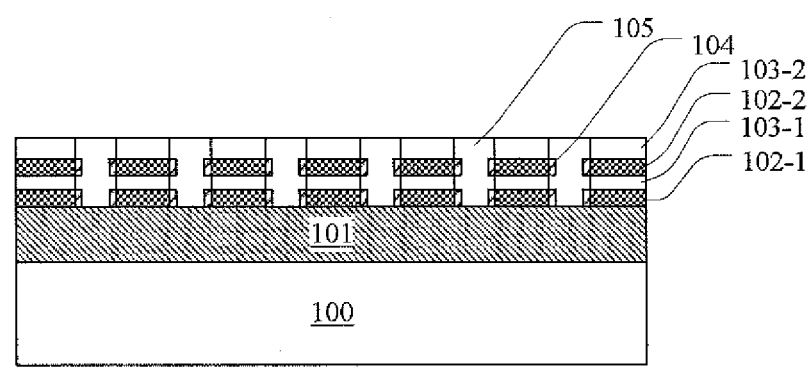
FIGS. 4-10 schematically show top views and cross-sectional views in various steps of a method for manufacturing a MOSFET according to embodiments of the present disclosure, in which lines A-A' in the top views indicate locations where the cross-sectional views are taken.

An oxide protection layer 105 is formed on the whole surface of the semiconductor structure by the above conventional deposition processes. The oxide protection layer 105 fills the gaps between the stack stripes. Next, the oxide protection layer 105 is subjected to chemical mechanical planarization (CMP), with the growth blocking layer 103-2 on top of the stack strips as a stop layer, as shown in FIG. 4

Consequently, the graphene nano-ribbons 104 are embedded in the oxide protection layer 105. The oxide protection layer 105 serves as a mechanical support for the graphene nano-ribbons 104 and as a protection layer for the graphene nano-ribbons 104 in the subsequent steps. The oxide protection layer 105 has a shape complementary to the stack stripes shown in FIG. 2, and is also patterned to stripes which extend in a direction perpendicular to the paper sheet.

Figure 5A:
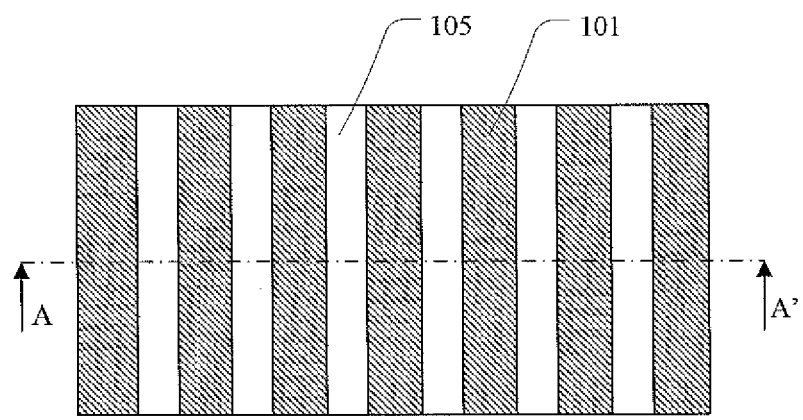
Figure 5B:
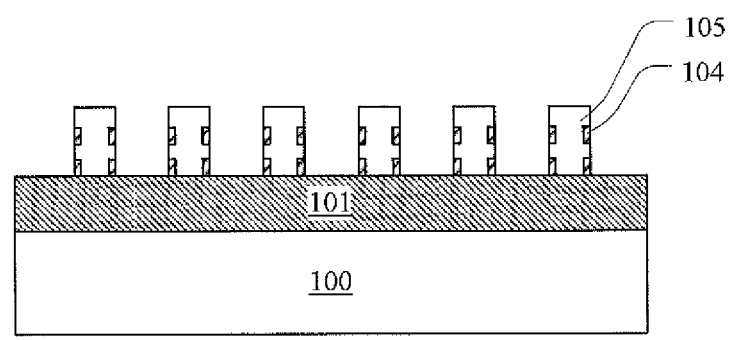

Next, the growth blocking layer 103-2, the seed layer 102-2, the growth blocking layer 103-1 and the seed layer 102-1 are removed from top to bottom by the above patterning processes, and thus the stack stripes are completely removed, as shown in FIGS. 5a and 5b.

Alternatively, the above patterning processes may be carried out with wet etching which selectively removes the growth blocking layer 103-2, the seed layer 102-2, the growth blocking layer 103-1 and the seed layer 102-1 with respect to the oxide protection layer 105 and the oxide base layer 101. No photoresist mask is needed in the wet etching, which further simplifies the process.

After the patterning processes, the oxide protection layer 105 remains as standing stripes, and the graphene nano-ribbons 104 are embedded in the oxide protection layer 105 and have surfaces being exposed at side surfaces of the oxide protection layer 105. Preferably, the portions of the graphene nano-ribbons 104 that serve as channel regions may be doped after removing the stack strips. For example, US patent application No. US2010/0102292A1 describes a method for doping the graphene nano-ribbons 104.

Figure 6A:
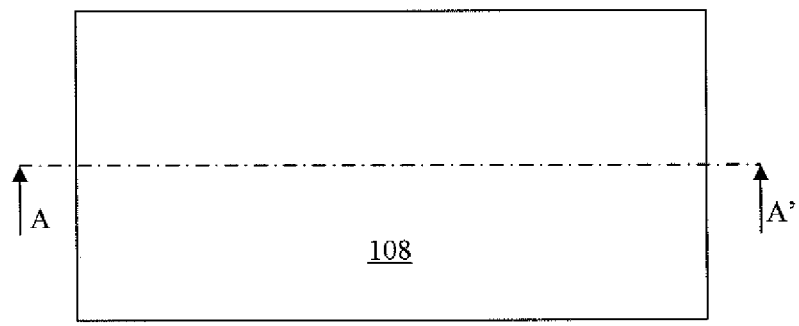
Figure 6B:
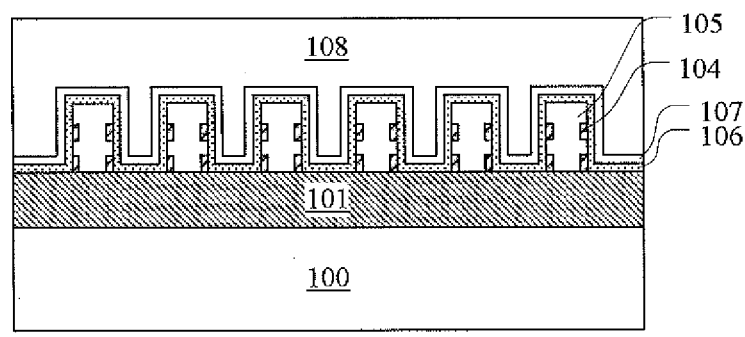

Next, a gate dielectric 106 and a diffusion barrier layer 107 are formed conformally on the whole surface of the semiconductor structure by the above conventional deposition processes. A gate conductor 108 is then formed thereon, as shown in FIGS. 6a and 6b. Preferably, the gate dielectric 106 may be formed by ALD, and the diffusion barrier layer 107 and the gate conductor 108 may be formed by sputtering.

The gate dielectric 106 is made of one selected from the group consisting of oxides, oxynitrides, high K and their combinations. The diffusion barrier layer 107 can be made of a stable metal, such as Ti, Pt, Au, or any stacks thereof. The gate conductor 108 can be made of a metal, doped polysilicon, or a stack of the metal and the doped polysilicon. Preferably, the gate dielectric 106 may be made of $Al_2O_3$, the diffusion barrier layer 107 may be made of Ti/Pt, and the gate conductor 108 may be it-situ doped polysilicon.

The gate dielectric 106 contacts the graphene nano-ribbons at the side surfaces of the oxide protection layer 105. The diffusion barrier layer 107 is located between the gate dielectric 106 and the gate conductor 108. Note that the diffusion barrier layer 107 is only an optional layer for preventing the material of the gate conductor 108 being diffused into the graphene nano-ribbons 104. The gate conductor 108 fills trenches in the oxide protection layer 105, and is then subjected to an additional CMP to provide a planar surface of the semiconductor structure.

Figure 7A:
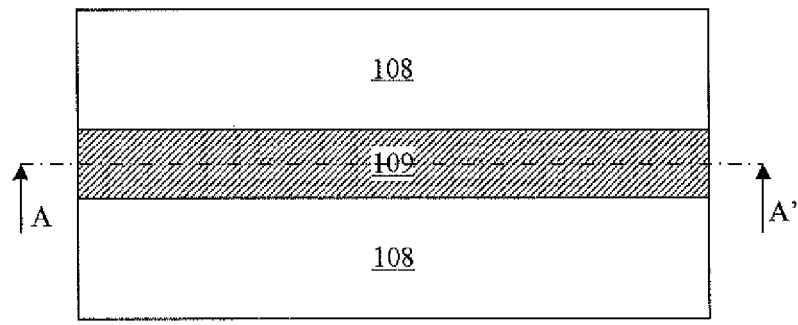
Figure 7B:
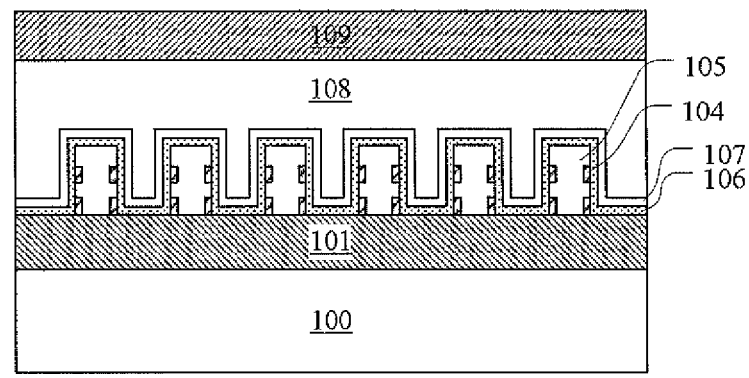
Figure 8A:
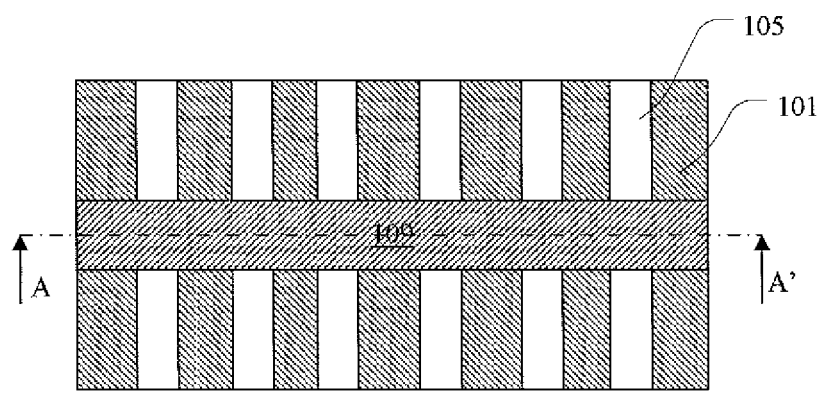
Figure 8B:
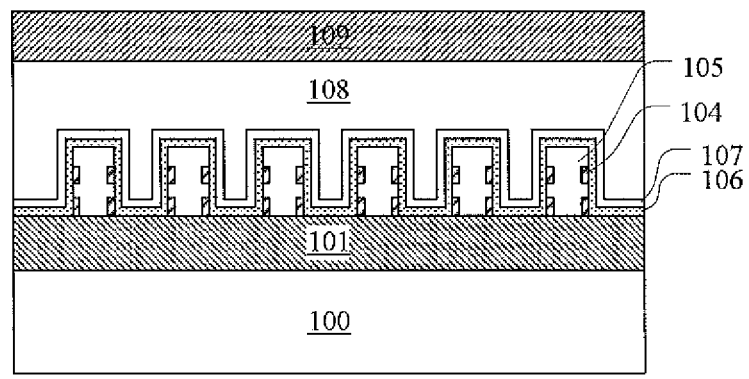

Next, a photoresist mask 109 is formed on the surface of the semiconductor structure for defining the shape of the gate, as shown in FIGS. 7a and 7b. The photoresist mask 109 has a stripe shape which extends laterally in the paper sheet.

Next, the exposed portion of the gate conductor 108 is removed by anisotropic dry etching such as ion beam milling, plasma etching, reactive ion etching, laser ablation and the like. The exposed portions of the diffusion barrier layer 107 and the gate dielectric 106 are then removed by wet etching using a solution of etchant, as shown 8a and 8b.

After the above two etching, the gate conductor 108 is formed as a stripe which extends in a similar direction to the photoresist mask 109 in the paper sheet. The gate conductor 108 extends in a direction perpendicular to the extension direction of the oxide protection layer 105. Top surfaces of the oxide protection layer 105 and the oxide base layer 101 and side surfaces of the oxide protection layer 105 and the graphene nano-ribbons embedded in the oxide protection layer 105, which are not covered by the photoresist mask 109, are exposed.

Figure 9A:
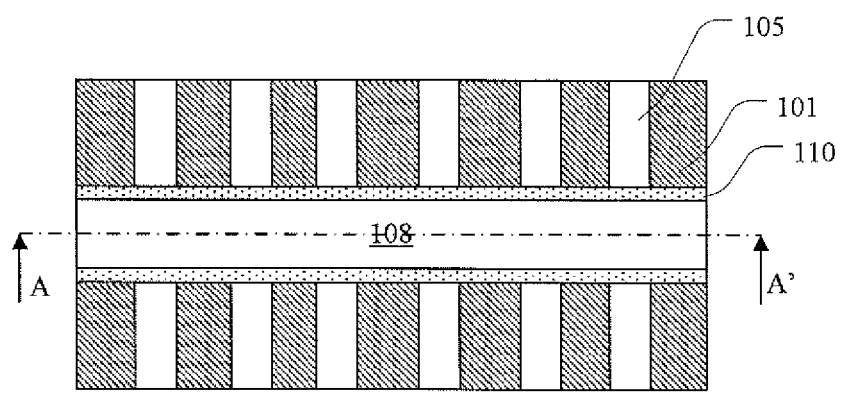
Figure 9B:
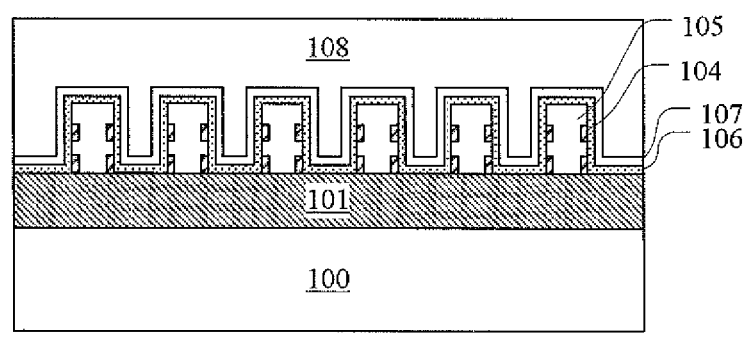

Next, the photoresist mask 109 is removed by ashing or dissolution in a solvent. A nitride layer is formed conformally on the whole surface of the semiconductor structure by the above conventional deposition processes, and then etched by reactive ion etching. The remaining portions of the nitride at side surfaces of the gate conductor 108 form sidewall spacers 110, as shown in FIGS. 9a and 9b.

Preferably, the portions of the graphene nano-ribbons 104 that serve as source regions and drain regions may be doped after forming the sidewall spacers 110. For example, US patent application No. US2010/0102292A1 describes a method for doping the graphene nano-ribbons 104.

Figure 10A:
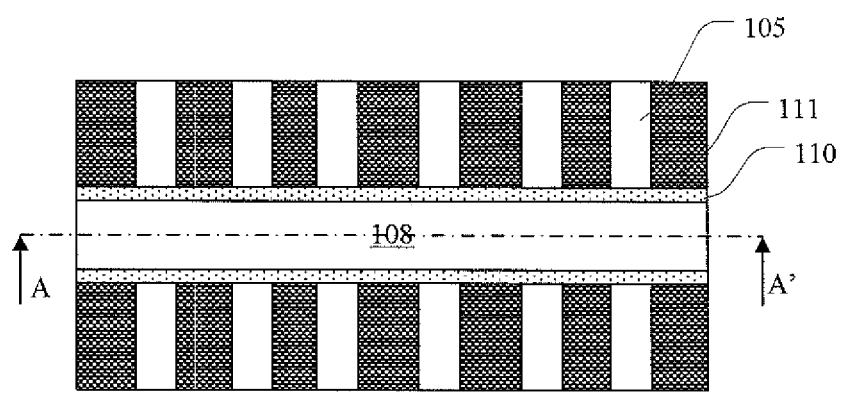
Figure 10B:
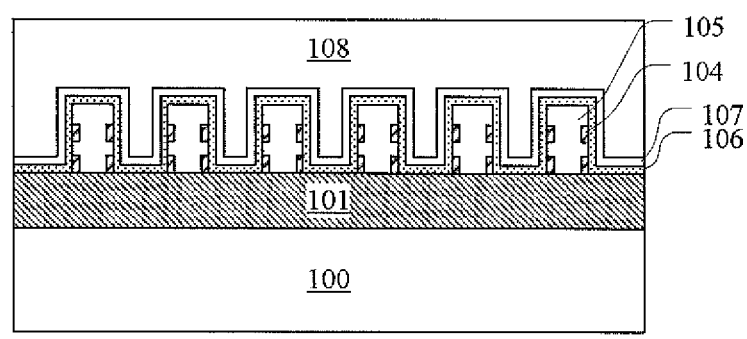

A metal layer (for example, Ti) is then formed to cover the whole surface of the semiconductor structure by the above conventional deposition processes. The metal layer at least fills the trenches in the oxide protection layer 105. The metal layer is then etched back. The portions of the metal layer outside the trenches in the oxide protection layer 105 remain and serve as source and drain contacts 111, as shown in FIGS. 10a and 10b.

The source and drain contacts 111 are in contact with the graphene nano-ribbons 104 embedded in the oxide protection layer 105 and having a surface being exposed at the side surfaces of the oxide protection layer 105.

Although it is not shown, after forming the source and drain contacts 111, an interlayer dielectric may be formed, and a plurality of conductive vies may be formed in the interlayer dielectric to reach the source and drain contacts 111 so as to complete the MOSFET.

Figure 11:
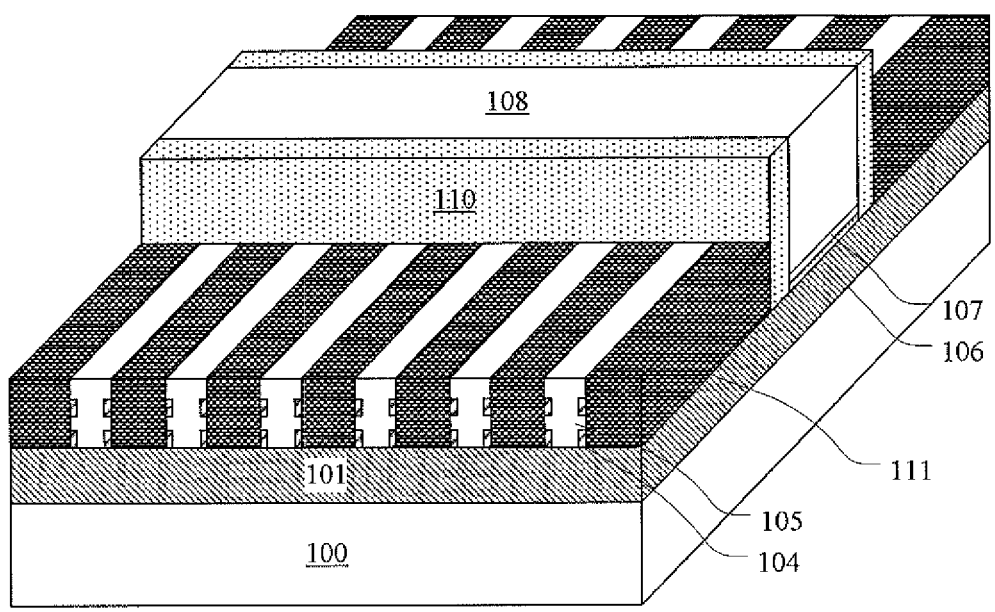
FIG. 11 schematically shows a perspective view of a MOSFET according to embodiments of the present disclosure.

FIG. 11 schematically shows a perspective view of a MOSFET according to the present disclosure, in which the interlayer dielectric and the conductive vies are not shown. The present MOSFET comprises a plurality of graphene nano-ribbons 104 (2×12=24 graphene nano-ribbons shown in FIG. 11) stacked in a vertical direction and arranged laterally. The graphene nano-ribbons are embedded in an oxide protection layer 105. A source region, a drain region and a channel region are formed in each of the plurality of graphene nano-ribbons 104. The channel region is located between the source region and the drain region. Source and drain contacts 111 are in contact with the source region and the drain region of each of the plurality of graphene nano-ribbons 104 respectively, at side surfaces of the oxide protection layer 105. A gate conductor 108 is located on the channel region of each of the plurality of graphene nano-ribbons 104, with a gate dielectric 106 sandwiched between the gate conductor 108 and the graphene nano-ribbons 104.

While the disclosure has been described with reference to specific embodiments, the description is illustrative of the disclosure. The description is not to be considered as limiting the disclosure. The description is not to be considered as limiting the disclosure.

We claim:

1. A MOSFET, comprising
an insulating substrate;
a protection layer on the insulating substrate;
at least one graphene nano-ribbon having its body embedded inside the protection layer but a side surface exposed by the protection layer at a corresponding side surface of the protection layer;
a gate stack disposed on the side surface of the protection layer and thus intersecting with the exposed side surface of the at least one graphene nano-ribbon, including a gate dielectric and a gate conductor stacked in sequence, wherein the gate stack defines a channel region in each of the at least one graphene nano-ribbon;
a source region and a drain region in each of the at least one graphene nano-ribbon, the channel region being located between the source region and the drain region; and a source contact and a drain contact which contact the source region and the drain region respectively on the side surface of the protection layer.

2. The MOSFET according to claim 1, wherein the at least one graphene nano-ribbon comprises a plurality of graphene nano-ribbons which are stacked in a vertical direction.

3. The MOSFET according to claim 1, wherein the at least one graphene nano-ribbon comprises a plurality of graphene nano-ribbons which are arranged laterally.

4. The MOSFET according to claim 1, wherein the at least one graphene nano-ribbon has a width of about 5-20 nm.

5. The MOSFET according to claim 1, wherein the at least one graphene nano-ribbon has a thickness substantially equal to one layer, two layers or more layers of carbon atoms of graphite.

6. The MOSFET according to claim 1, wherein the gate conductor extends in a direction perpendicular to an extension direction of the at least one graphene nano-ribbon.

7. The MOSFET according to claim 1, further comprising a diffusion barrier layer between the gate conductor and the gate dielectric.

8. The MOSFET according to claim 1, wherein the protection layer is made of an oxide.

9. The MOSFET according to claim 1, wherein the protection layer extends in a first direction, the at least one graphene nano-ribbon extends along the protection layer in the first direction, and the gate stack extends in a second direction crossing the first direction.

10. The MOSFET according to claim 1, wherein the at least one graphene nano-ribbon comprises a number of graphene nano-ribbons in pairs, each pair being disposed in the protection layer opposite to each other and thus having their respective side surfaces exposed by opposite side surfaces of the protection layer.

11. The MOSFET according to claim 1, wherein each pair of the graphene nano-ribbons are disposed in the protection layer at substantially the same level.

* * * * *